(12) United States Patent
Heinrich-Barna et al.

(10) Patent No.: US 9,799,408 B2
(45) Date of Patent: Oct. 24, 2017

(54) MEMORY CIRCUIT WITH LEAKAGE COMPENSATION

(71) Applicant: TEXAS INSTRUMENTS INCORPORATED, Dallas, TX (US)

(72) Inventors: Stephen Keith Heinrich-Barna, Lucas, TX (US); Raviprakash Suryanarayana Rao, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/050,678

(22) Filed: Feb. 23, 2016

(65) Prior Publication Data

US 2017/0243659 A1    Aug. 24, 2017

(51) Int. Cl.
G11C 11/00 (2006.01)
G11C 13/00 (2006.01)
G11C 17/08 (2006.01)

(52) U.S. Cl.
CPC .................................. *G11C 17/08* (2013.01)

(58) Field of Classification Search
CPC . G11C 11/413; G11C 11/417; G11C 13/0021; G11C 5/14; G11C 8/10; G11C 17/08
See application file for complete search history.

(56) References Cited

U.S. PATENT DOCUMENTS

| 9,406,374 B1* | 8/2016 | Singh | G11C 11/418 |
| 2001/0038563 A1* | 11/2001 | Sowards | G11C 7/067 365/207 |
| 2002/0136047 A1 | 9/2002 | Scheuerlein | |
| 2005/0030782 A1 | 2/2005 | Takahashi et al. | |
| 2007/0076462 A1* | 4/2007 | Richter | G11C 16/3418 365/94 |
| 2013/0322186 A1* | 12/2013 | Lee | G11C 8/08 365/189.09 |

FOREIGN PATENT DOCUMENTS

WO    2010149055 A1    12/2010

OTHER PUBLICATIONS

International Search Report for PCT/US2017/019154 dated May 25, 2017.

* cited by examiner

*Primary Examiner* — Hien Nguyen
(74) *Attorney, Agent, or Firm* — John R. Pessetto; Charles A. Brill; Frank D. Cimino

(57) ABSTRACT

A memory array comprising a word line and a bit line is disclosed. Each of a plurality of memory cells of the memory array has a first terminal connected to the bit line and a current path between the first terminal and a respective second terminal. A first memory cell of the plurality of memory cells has the second terminal coupled to receive a first supply voltage when selected by the word line. A second memory cell of the plurality of memory cells has the second terminal coupled to receive a voltage different from the first supply voltage when the first memory cell is selected by the word line.

2 Claims, 5 Drawing Sheets

US 9,799,408 B2

MEMORY CIRCUIT WITH LEAKAGE COMPENSATION

BACKGROUND OF THE INVENTION

The present embodiments relate to a memory circuit with leakage compensation of unselected memory cells.

Shrinking semiconductor integrated circuit feature sizes have placed increasing challenges on semiconductor integrated circuit design. In particular, minimum feature sizes of high density memory cells are frequently less than corresponding feature sizes of peripheral circuits. As a result, leakage current in unselected memory cells ($I_{LEAK}$) may adversely affect correct sensing of a selected memory cell on a common bit line. This is particularly true of nonvolatile memories such as Flash EEPROM and ROM memories. However, this undesirable leakage current may also adversely affect standby current of volatile SRAM memories. Moreover, undesirable leakage current may compromise operation of both embedded memories in System on Chip (SoC) applications as well as stand-alone memories. Thus, there is a need to reduce leakage current in unselected memory cells for both nonvolatile and volatile memory systems. Accordingly, embodiments of the present invention described below are directed toward this and other improvements over the prior art.

BRIEF SUMMARY OF THE INVENTION

In a first embodiment of the present invention, there is disclosed a memory array having a word line and a bit line. Each of a plurality of memory cells of the memory array has a first terminal connected to the bit line and a current path between the first terminal and a respective second terminal. A first memory cell of the plurality of memory cells has the second terminal coupled to receive a first supply voltage when selected by the word line. A second memory cell of the plurality of memory cells has the second terminal coupled to receive a voltage different from the first supply voltage when the first memory cell is selected by the word line In a second embodiment of the present invention, there is disclosed a plurality of memory cells. Each memory cell has a first terminal, a second terminal, and a control terminal arranged to control current flow between the respective first and second terminals. A plurality of bit lines are connected to first terminals of respective memory cells. A bias circuit is arranged to apply a supply voltage to the second terminals of the memory cells in a first mode of operation and to apply a bias voltage different from the supply voltage to the second terminals in a second mode of operation.

DETAILED DESCRIPTION OF THE INVENTION

Figure 1:
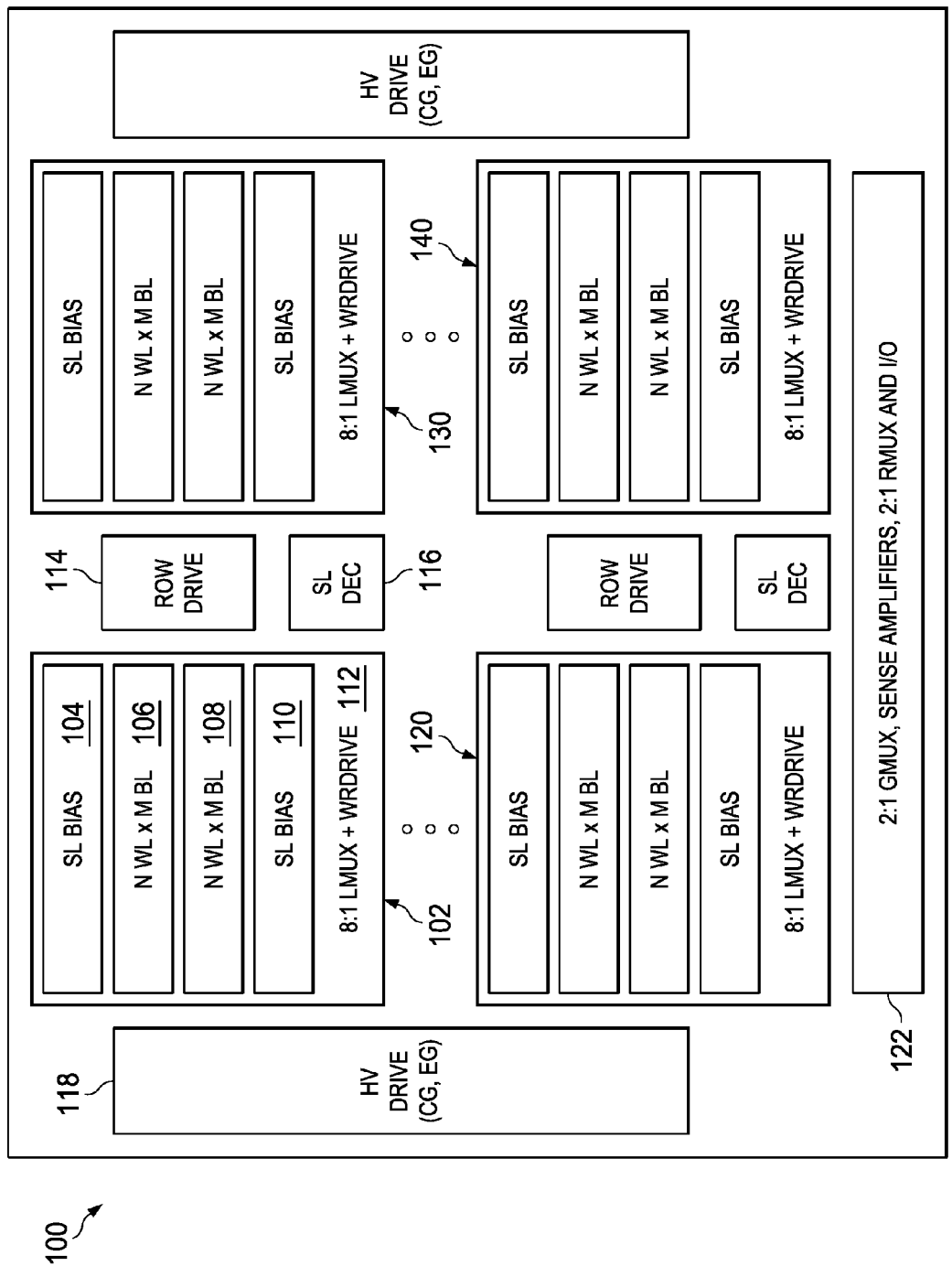
FIG. 1 is a diagram of an exemplary memory circuit according to the present invention.

Referring to FIG. 1, there is a diagram of an exemplary memory circuit 100 according to the present invention. The memory circuit, often referred to as a macro, may be used for a System on a Chip (SoC), embedded memory, or stand alone memory applications. The diagram shows four memory sectors 102, 120, 130, and 140. Additional memory sectors may be included as indicated by ellipses. Each memory sector is substantially the same, so only memory sector 102 will be described in detail. In the following discussion, the same reference numerals are used to describe substantially the same circuit elements. Memory sector 102 includes memory blocks 106 and 108 and respective source line bias circuits 104 and 110 as will be described in detail. Each memory block includes N word lines (WL) and M bit lines (BL), where N and M are positive integers. Each word line corresponds to a respective row of memory cells, and each bit line corresponds to a respective column of memory cells. The choice of N and M depends on the memory requirements for a particular application. For example, N may be 256, 512, or other value and may include additional rows of memory cells for redundancy. Correspondingly M may be 256, 512, 1024, or other value and may include other columns of memory cells for redundancy or parity bits for error correction (ECC) memory. For example, N may be 256 or 512 and M may 2304, where 256 columns are dedicated to ECC parity bits The memory circuit of FIG. 1 also includes row decode and drive circuit 114 to select appropriate word lines in response to applied address signals. A source line (SL) decode circuit 116 decodes applied address signals to control source line bias circuits 104 and 110 and may include corresponding control logic. High voltage drive circuit 118 decodes and applies high voltage signals to selected control gates (CG) and erase gates (EG) for programming and erasing memory cells of blocks 106 and 108. Circuit 112 applies write drive (WRDRIVE) signals to write date to the memory cells. Circuit 112 also includes an 8:1 multiplex circuit to selectively couple a local bit line (LBL) signal to a global bit line (GBL). The global bit line is selectively coupled to a sense amplifier in circuit 122 by global bit line multiplexer GMUX. After amplification, data signals are subsequently multiplexed by a read multiplex (RMUX) circuit to input/output (I/O) terminals of the SoC.

Figure 2:
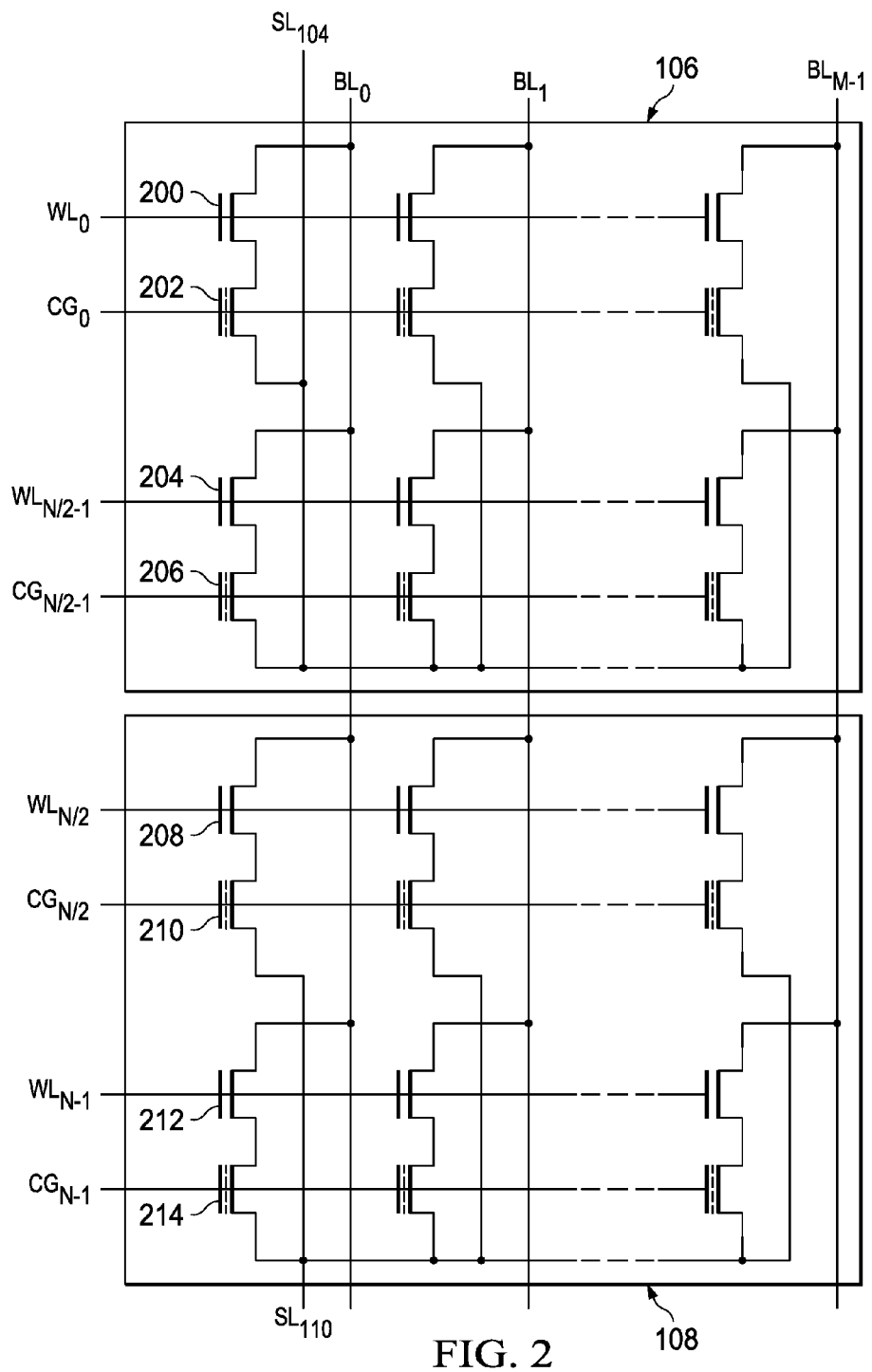
FIG. 2 is a simplified circuit diagram of memory blocks 106 and 108 of FIG. 1.

Referring next to FIG. 2, there is a simplified circuit diagram of memory blocks 106 and 108 of FIG. 1. Block 106 is coupled to receive word lines $WL_0$ through $WL_{N/2-1}$ and control gate leads $CG_0$ through $CG_{N/2-1}$. Block 106 is also coupled to receive bit lines $BL_0$ through $BL_{M-1}$. Block 106 includes a memory cell formed at each intersection of a respective word line and bit line such as the memory cell formed by transistors 200 and 202 and the memory cell formed by transistors 204 and 206. Transistor 202 provides access to floating gate transistor 202. Likewise, transistor 204 provides access to floating gate transistor 206. Transistors 202 and 206 have control gates coupled to receive signals $CG_0$ and $CG_{N/2-1}$, respectively. Transistors 202 and 206 also have respective floating erase gates (EG) indicated by dashed lines as is known in the art. The source of each floating gate transistor of block 106 is coupled to source line $SL_{104}$ from SL BIAS circuit 104.

Block 108 is similar to block 106 and is coupled to receive word lines $WL_{N/2}$ through $WL_{N-1}$ and control gate leads $CG_{N/2}$ through $CG_{N-1}$. Block 108 is also coupled to receive bit lines $BL_0$ through $BL_{M-1}$, which are shared with block 106. A memory cell is formed at each intersection of a respective word line and bit line of block 108 such as the memory cell formed by transistors 208 and 210 and the memory cell formed by transistors 212 and 214. Transistor 208 provides access to floating gate transistor 210. Likewise, transistor 212 provides access to floating gate transistor 214. Transistors 210 and 214 have control gates coupled to receive signals $CG_{N/2}$ and $CG_{N-1}$, respectively. Transistors 210 and 214 also have respective floating erase gates (EG) indicated by dashed lines as is known in the art. The source of each floating gate transistor of block 108 is coupled to source line $SL_{110}$ from SL BIAS circuit 110.

Figure 3:
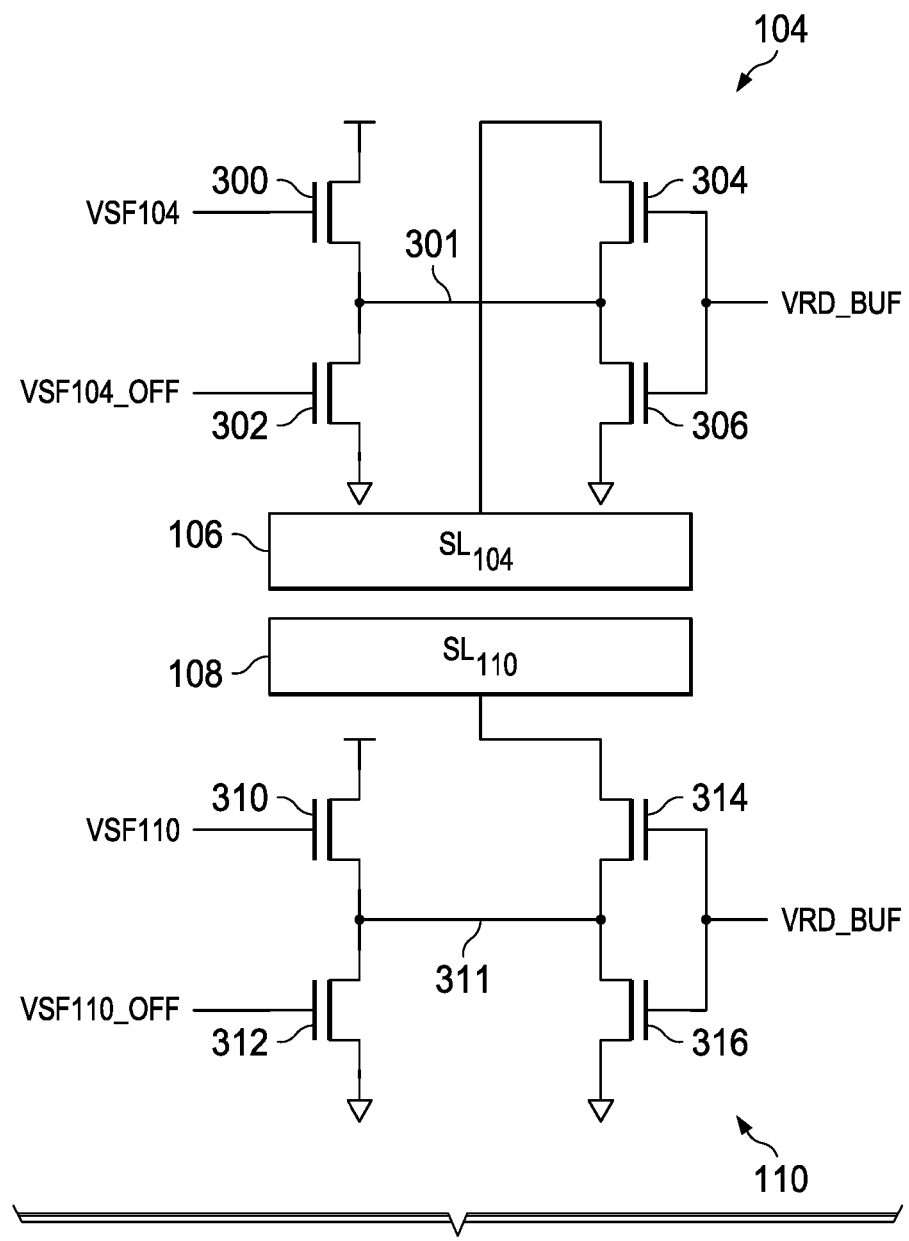
FIG. 3 is a circuit diagram of source line (SL) bias circuits 104 and 110 of FIG. 1 coupled to respective memory blocks 106 and 108.

Turning now to FIG. 3, there is a circuit diagram of source line (SL) bias circuits 104 and 110 of FIG. 1 coupled to respective memory blocks 106 and 108. In the following discussion, transistor sizes are provided as width/length (W/L) in units of micrometers by way of explanation. One of ordinary skill in the art will understand that these transistor sizes are only provided by way of example and may vary with different values of N and M (FIG. 1). SL bias circuit 104 includes n-channel transistor 300 (3.9/0.4) connected in series with n-channel transistor 302 (1.95/0.07) between supply voltage leads VDD (horizontal line) and VSS (small triangle). SL bias circuit 104 also includes n-channel transistor 304 (3.0/0.07) connected in series with n-channel transistor 306 (1.0/1.0) between source line $SL_{104}$ and supply voltage lead VSS. A common terminal 301 of transistors 300 and 302 is connected to a common terminal of transistors 304 and 306. SL bias circuit 110 is similar to SL bias circuit 104 and includes n-channel transistor 310 (3.9/0.4) connected in series with n-channel transistor 312 (1.95/0.07) between supply voltage leads VDD and VSS. SL bias circuit 110 also includes n-channel transistor 314 (3.0/0.07) connected in series with n-channel transistor 316 (1.0/1.0) between source line $SL_{110}$ and supply voltage lead VSS. A common terminal 311 of transistors 310 and 312 is connected to a common terminal of transistors 314 and 316.

Operation of SL bias circuit 104 is similar to operation of SL bias circuit 110, so only operation of SL bias circuit 104 will be described in detail. Transistor 300 is coupled to receive control signal VSF104, and transistor 302 is coupled to receive complementary control signal VSF104_OFF. When memory sector 102 is not accessed, control signals VSF104 and VSF104_OFF are low and high, respectively. Thus, transistor 300 is off, transistor 302 is on, and lead 301 is driven to supply voltage VSS. Control signal VRD_BUF is held high, so transistors 304 and 306 are both on, and transistor 304 drives $SL_{104}$ to supply voltage VSS at lead 301. In the same manner, control signals VSF110 and VSF110_OFF are low and high, respectively, and transistor 314 drives $SL_{110}$ to supply voltage VSS at lead 311.

When a memory cell of block 108 is accessed in a read mode, control signals VSF110 and VSF110_OFF remain low and high, respectively, and $SL_{110}$ remains at supply voltage VSS. Control signals VSF104 and VSF104_OFF, however, transition to high and low levels, respectively. Thus, transistor 300 is on and transistor 302 is off. Transistor 300 acts as a source follower and drives lead 301 to an n-channel transistor threshold voltage below supply voltage VDD (VDD-Vtn). Control signal VRD_BUF remains high, so transistors 304 and 306 are both on. Thus, transistor 304 drives $SL_{104}$ to VDD-Vtn. Transistor 306 is a relatively high resistance transistor and acts as a bleeder or keeper device to assure lead 301 does not rise above VDD-Vtn.

SL bias circuits of the present invention are highly advantageous for several reasons. First, access time to a memory cell in block 108 is not compromised, since $SL_{110}$ is held at supply voltage VSS during a read operation. Second, $SL_{104}$ is raised to VDD-Vtn when the memory cell in block 108 is accessed. Thus, memory cells in block 106 connected to the same bit line as the accessed memory cell of block 108 have greatly reduced leakage current. A typical read current of an erased memory cell is approximately 25 μA. The present inventors have determined that leakage of unselected memory cells on a selected bit line of the prior art, however, may be as much as 16 μA/kbit. This excessive leakage current adversely affects the signal-to-noise ratio (SNR) of data from an accessed memory cell. By further investigation, the present inventors have determined that raising a source line of unselected memory cells on a selected bit line by as little as 200 mV above supply voltage VSS will reduce leakage current by approximately two orders of magnitude (100×), thereby greatly improving the SNR of the accessed memory cell. Third, source follower transistor 300 quickly drives lead 301 to VDD-Vtn, so leakage current is reduced prior to sensing data from the accessed memory cell. Fourth, transistor 302 assures that lead 301 will not rise to a level greater than VDD-Vtn to adversely affect reliability. Finally, the SL bias circuits of the present invention produce no static power dissipation. Moreover, SL bias circuits such as SL bias circuit 104 may include several circuits such as transistors 300 through 306, wherein each individual SL bias circuit is decoded by appropriate column address signals. Thus, source line capacitance driven by each SL bias circuit may be limited to memory cells of a few respective bit lines of a respective sector.

Figure 4:
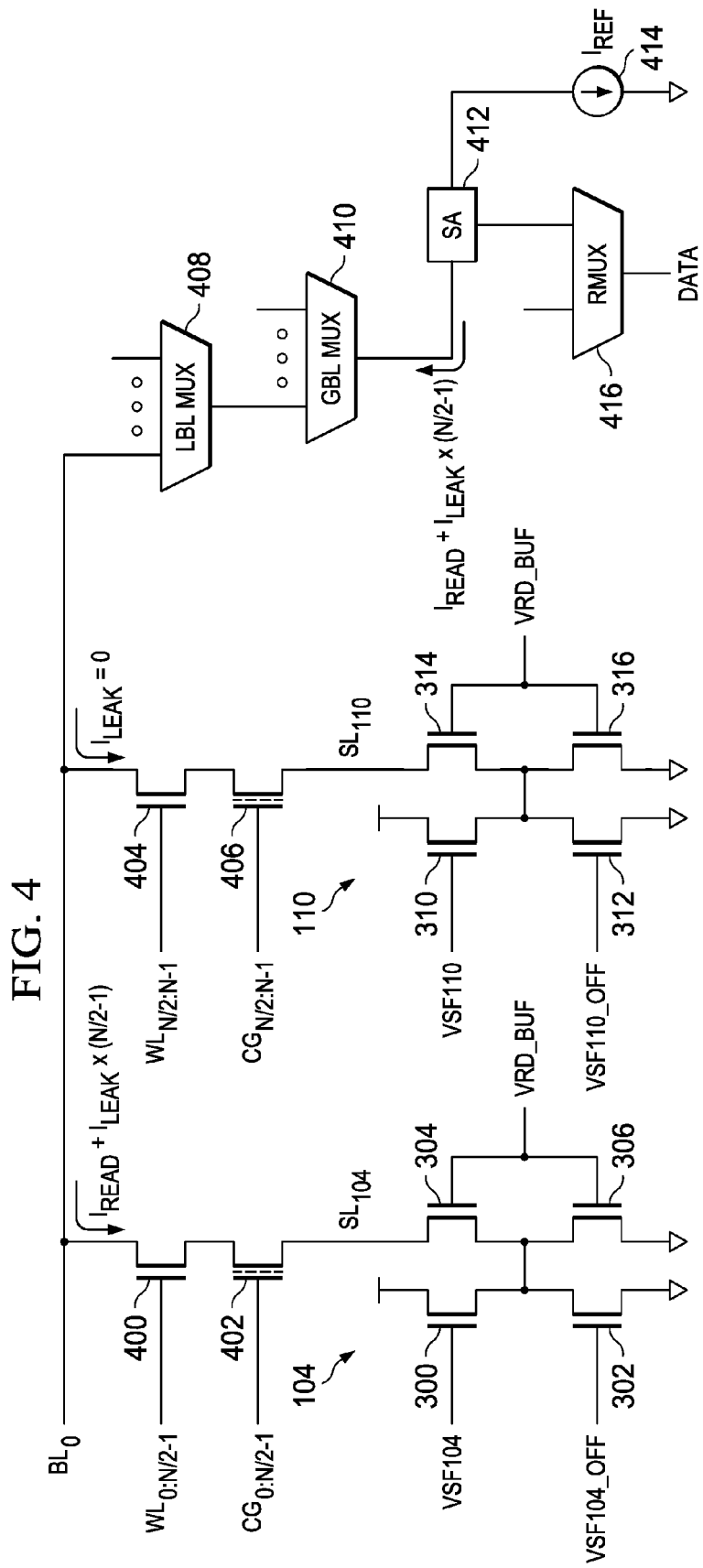
FIG. 4 is a circuit diagram showing operation of memory sector 102 of FIG. 1 during a memory read operation according to the present invention.
Figure 5:
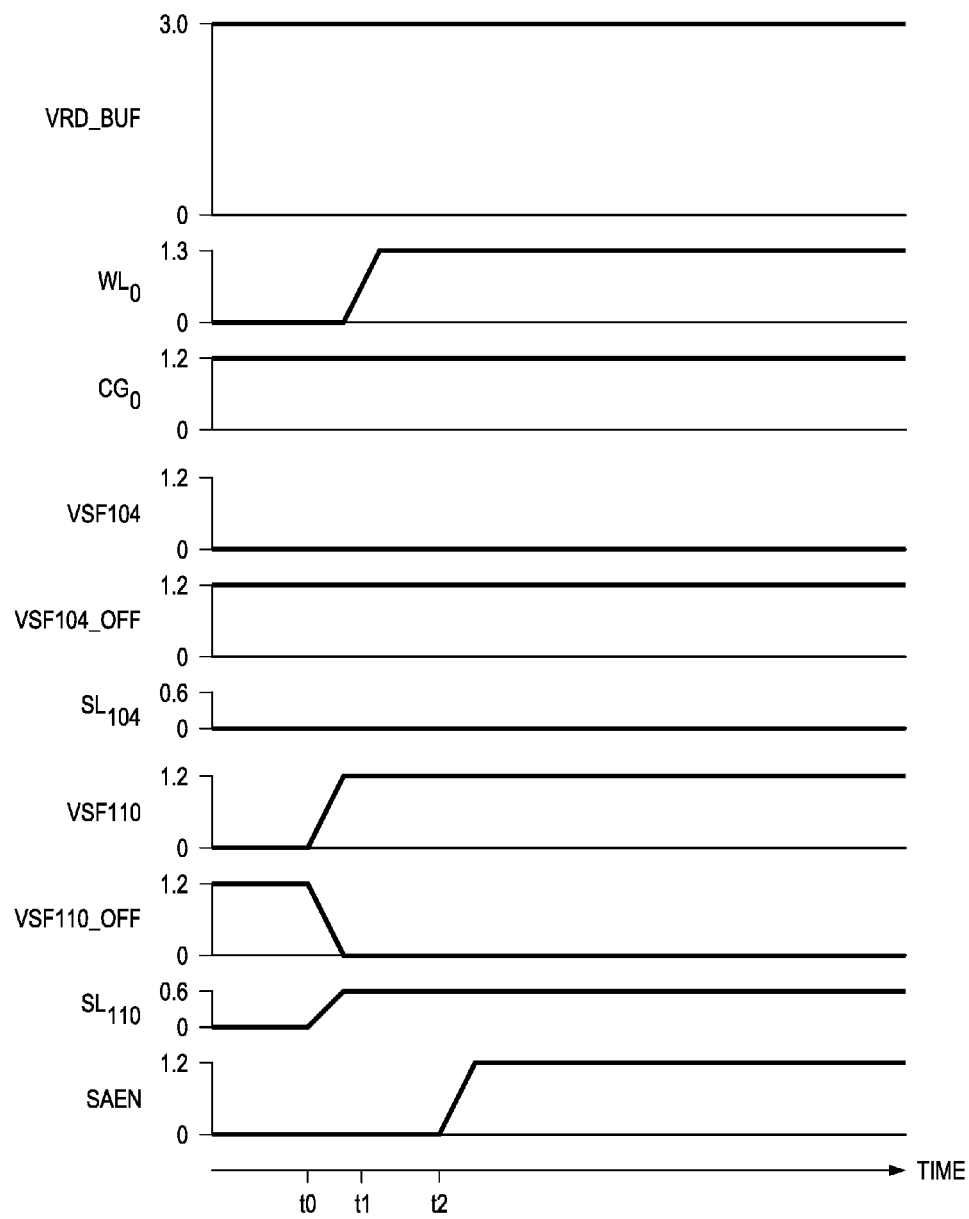
FIG. 5 is a timing diagram showing operation of memory sector 102 of FIG. 4 during the memory read operation.

Turning now to FIG. 4, is a circuit diagram showing operation of memory sector 102 of FIG. 1 during a memory read operation according to the present invention. Operation of the circuit will be explained with reference to the timing diagram of FIG. 5 for a read operation of the memory cell at the intersection of $WL_0$ and $BL_0$. In the following discussion, transistors 400 and 402 represent all lumped memory cells in block 106 connected to $BL_0$. Transistors 404 and 406 represent all lumped memory cells in block 108 connected to $BL_0$. Initially, VSF104 and VSF110 are low (0.0 V) and VSF104_OFF and VSF110_OFF are high (1.2 V). VRD_BUF is high (3.0 V), so transistors 304, 306, 314, and 316 are on. Source lines $SL_{104}$ and $SL_{110}$, therefore, are held at VSS (0.0 V) by transistors 304 and 314, respectively. At time t0, VSF110 goes high (1.2 V), and VSF110_OFF goes low (0.0 V). As previously discussed, this drives $SL_{110}$ to VDD-Vtn (0.6 V). As a result, current $I_{LEAK}$ through memory cell 404/406 is substantially zero. At time t1, word line $WL_0$ goes high (1.3 V) and turns on access transistor 200 (FIG. 2). As a result, current $T_{READ}$ flows through memory cell 200/202, and current $I_{LEAK} \times (N/2-1)$ flows through the unselected memory cells of block 106 connected to bit line $BL_0$. For large N, therefore, leakage current due to unselected memory cells connected to bit line $BL_0$ is advantageously reduced by half. Bit line $BL_0$ is selectively coupled to one input terminal of sense amplifier 412 by local bit line multiplex circuit 408 and global bit line multiplex circuit 410. Reference current source 414 is coupled to the other input terminal of sense amplifier 412. Sense amplifier 412 is initially precharged high, so the differential current at the input terminals produces a differential input voltage. At time t2, sense amplifier enable signal SAEN goes high (1.2 V) to amplify the difference voltage. Read multiplex circuit 416 selectively applies the amplified difference voltage (DATA) to output circuit 122.

As previously discussed, SL bias circuits of the present invention substantially improve the SNR at the sense amplifier. For example, if there are 256 memory cells on $BL_0$ (N=256), in each of blocks 106 and 108, leakage current is reduced from 8 µA to 4 µA through $BL_0$. Read current remains approximately 25 µA, so net current at the sense amplifier is 21 µA rather than 17 µA. This is a 24% improvement in signal strength at the sense amplifier. Of course, further SNR improvement is possible by increasing the number of blocks per sector, thereby increasing the number of source lines per bit line. For example, if there are four blocks in a sector with 128 memory cells on each source line, leakage current is reduced from 8 µA to 2 µA through $BL_0$. Read current remains approximately 25 µA, so net current at the sense amplifier is 23 µA rather than 17 µA. This is a 35% improvement in signal strength at the sense amplifier.

Still further, while numerous examples have thus been provided, one skilled in the art should recognize that various modifications, substitutions, or alterations may be made to the described embodiments while still falling with the inventive scope as defined by the following claims. For example, other circuit components may be used to increase the source line voltage of unselected memory cells on a selected bit line. Moreover, embodiments of the present invention are equally applicable to other memory circuits such as read only memory (ROM) circuits. Embodiments of the present invention may also be applied to static random access memory (SRAM) circuits or various logic circuits to reduce standby current. Other combinations will be readily apparent to one of ordinary skill in the art having access to the instant specification.

What is claimed is:

1. A memory array, comprising:
   a word line;
   a bit line;
   a plurality of memory cells, wherein each memory cell has a first terminal connected to the bit line and a current path between the first terminal and a respective second terminal;
   a first memory cell of the plurality of memory cells having the second terminal coupled to receive a first supply voltage when selected by the word line; and
   a second memory cell of the plurality of memory cells having the second terminal coupled to receive a voltage different from the first supply voltage when the first memory cell is selected by the word line;
   a first transistor having a current path coupled between a second supply voltage terminal and a common terminal;
   a second transistor having a current path coupled between the common terminal and a terminal having the first supply voltage;
   a third transistor having a current path coupled between the second terminal and the common terminal; and
   a fourth transistor having a current path coupled between the common terminal and the terminal having the first supply voltage.

2. The memory array of claim 1, wherein the first transistor is arranged to operate as a source follower.

\* \* \* \* \*